(12) United States Patent
Campbell

(10) Patent No.: US 7,672,060 B2
(45) Date of Patent: Mar. 2, 2010

(54) LENS UNIT

(75) Inventor: Colin Campbell, Edinburgh (GB)

(73) Assignee: STMicroelectronics (Research & Development) Limited, Marlow-Buckinghamshire (GB)

( * ) Notice: Subject to any disclaimer, the term of this patent is extended or adjusted under 35 U.S.C. 154(b) by 61 days.

(21) Appl. No.: 11/838,346

(22) Filed: Aug. 14, 2007

(65) Prior Publication Data

US 2008/0043340 A1    Feb. 21, 2008

(30) Foreign Application Priority Data

Aug. 15, 2006   (EP)   ................... 06118928

(51) Int. Cl.
*G02B 3/12* (2006.01)
*G02B 7/02* (2006.01)
*H04N 5/262* (2006.01)

(52) U.S. Cl. .............. 359/666; 359/811; 348/240.3

(58) Field of Classification Search ........... 348/207.99, 348/240.3; 359/666, 676, 811
See application file for complete search history.

(56) References Cited

U.S. PATENT DOCUMENTS

| | | | | |
|---|---|---|---|---|
| 5,168,384 A | * | 12/1992 | Genba | 349/58 |
| 5,176,140 A | * | 1/1993 | Kami et al. | 600/459 |
| 5,612,804 A | * | 3/1997 | Hara | 349/149 |
| 5,669,389 A | * | 9/1997 | Rotteveel et al. | 600/459 |
| 5,826,126 A | * | 10/1998 | Nomura et al. | 396/542 |
| 6,836,669 B2 | * | 12/2004 | Miyake et al. | 455/556.1 |
| 2006/0110580 A1 | * | 5/2006 | Aylward et al. | 428/172 |
| 2006/0146416 A1 | | 7/2006 | Lee | 359/676 |
| 2008/0088939 A1 | * | 4/2008 | Jung | 359/665 |

FOREIGN PATENT DOCUMENTS

| | | |
|---|---|---|
| EP | 1640326 | 3/2006 |
| WO | 03/010580 | 2/2003 |

* cited by examiner

*Primary Examiner*—David N Spector
(74) *Attorney, Agent, or Firm*—Lisa K. Jorgenson; Allen, Dyer, Doppelt, Milbrath & Gilchrist, P.A.

(57) ABSTRACT

A lens unit includes a lens having a focal length variable responsive to an applied electrical field, and an electrical connector. The electrical connector is a flexible circuit element that connects the lens to an electrical power supply.

28 Claims, 2 Drawing Sheets

LENS UNIT

FIELD OF THE INVENTION

The present invention relates to a lens unit, and more particularly, but not exclusively, to a lens unit comprising flexible circuitry, such as for a digital camera integrated into a mobile telephone.

BACKGROUND OF THE INVENTION

Liquid lenses having a variable focal length that varies with a voltage applied across them are used in digital cameras for mobile telephones. However, in a typical digital camera in a mobile telephone, electrical connections to the terminals of a liquid lens have a high failure rate.

A number of connection schemes have been used in the manufacture of mobile telephone cameras. One current connection scheme involves the routing of copper tracks inside channels formed in an injection molded mount. This connection scheme is expensive and complex to manufacture. Also, there is a high yield failure rate associated with this connection scheme.

An alternative connection scheme involves the soldering of wires between the substrate and the lens unit. This is unreliable due to the brittleness of the soldered connection, and is also costly to assemble. A further connection scheme employs resilient copper spring contacts to contact the terminals of the lens unit to a voltage supply. This arrangement is difficult and expensive to process manufacture.

SUMMARY OF THE INVENTION

According to a first aspect, a lens unit comprises a lens having a focal length variable responsive to an applied electric field, and an electrical connector to connect the lens to an electrical power supply. The electrical connector may comprise a flexible circuit element.

The use of a flexible circuit element simplifies the manufacture of the lens unit as compared to prior art connection arrangements, and may also reduce the failure rate. This is because the modes of failure associated with the prior art arrangements are at least partially removed by the use of a flexible circuit element.

The lens may comprise a liquid lens. The lens may comprise first and second terminals. The electrical connector may be arranged to connect either, or both, of the first and/or second terminals to the electrical power supply. The electrical connector may be connected to either, or both, of the first and/or second terminals by an electrically conducting adhesive. The electrical connector may be connected to an output of the electrical power supply by an electrically conducting adhesive. The use of an electrically conducting adhesive simplifies the processing required as compared to the prior art arrangements.

The flexible circuit element may comprise an electrical component and/or a circuit. The electrical components may comprise a passive electrical component. The circuitry may comprise a drive circuit. The provision of passive components and/or drive circuits on the flexible circuit allows these components to be removed from a substrate, thereby yielding greater substrate area for other signal processing applications.

According to a second aspect, an electronic device comprises a lens unit according to the first aspect. The electronic device may comprise any of the following: digital still camera, digital video camera, mobile telephone, web-cam, and an endoscope.

These and other aspects of the present invention will be apparent and more clear with reference to the embodiments described below.

BRIEF DESCRIPTION OF THE DRAWINGS

Embodiments of the present invention will now be described, by way of example only, with reference to the accompanying drawings, in which.

DETAILED DESCRIPTION OF THE PREFERRED EMBODIMENTS

Figure 1:
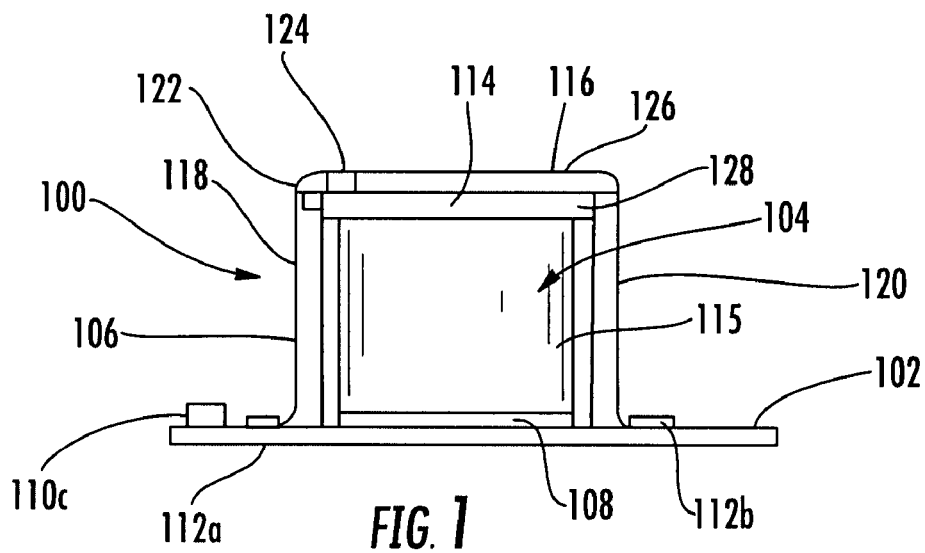
FIG. 1 is a side view of a sensor unit comprising a lens unit according to the present invention.
Figure 2:
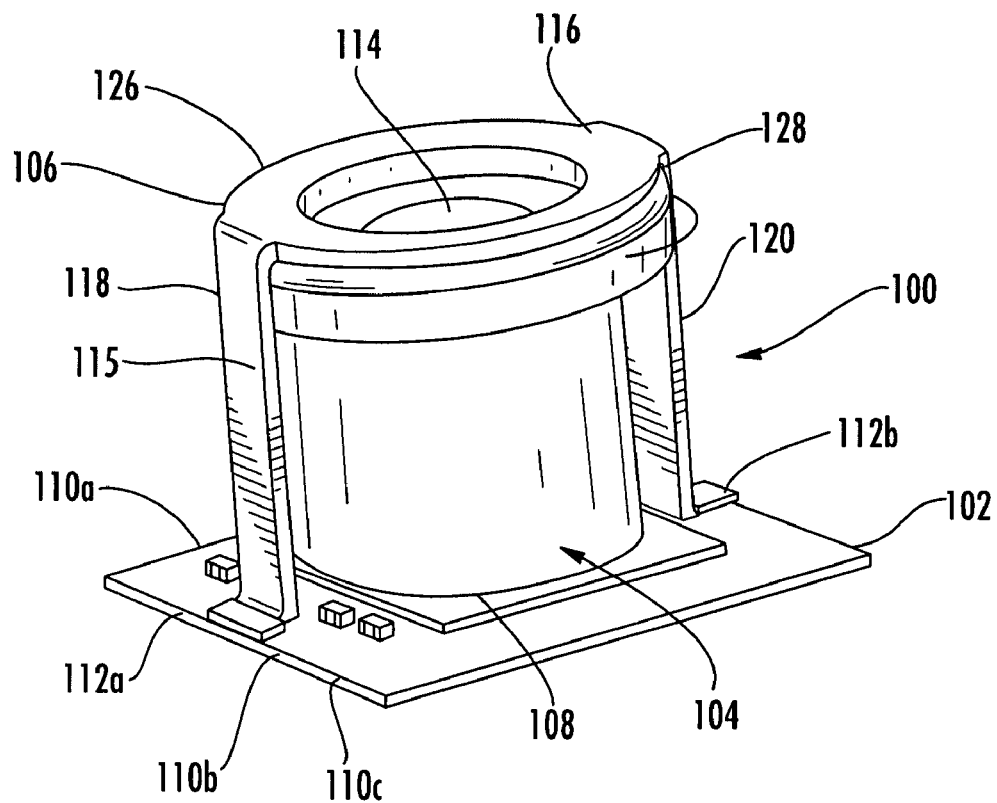
FIG. 2 is a cut-away perspective view of the lens unit of FIG. 1.
Figure 3:
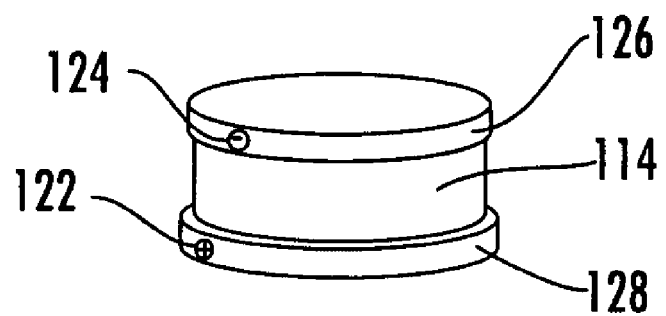
FIG. 3 is a perspective side view of terminal regions of the lens unit of FIG. 1.

Referring now to FIGS. 1 to 3, a camera 100 comprises a substrate 102, an optical stack 104 and a flexible circuit 106. The substrate 102 comprises a sensor 108, electrical components 110a-110c, and positive and negative power supply connections 112a, 112b on the substrate. The optical stack 104 comprises a cylindrical liquid lens 114 and a cylindrical housing 116. The housing 115 is mounted coaxially with the liquid lens 114, and between the liquid lens 114 and the substrate 102.

The flexible circuit 106 comprises an annular body portion 116 and two rectangular legs 118, 120 diametrically opposed to the body portion 116. The annular body portion 116 is located about the periphery of the liquid lens 114 such that is does not obscure the field of view of the liquid lens 114. The legs 118, 120 extend from the body portion 116 toward the substrate 104 where they are electrically connected to the respective positive and negative power supply connections 112a, 112b. Typically, the legs 118, 120 are connected to the power supply connections 112a, 112b by an electrically conductive glue or solder.

The liquid lens 114 comprises positive and negative terminals 122, 124. In the present embodiment the positive terminal 122 is located on an outer surface 126 of the lens 114, and the negative terminal 124 is located on a side surface 128 of the lens 114 adjacent the positive terminal 122. Typically, the flexible circuit 106 is connected to the terminals 122, 124 by an electrically conductive glue or solder.

The liquid lens 114 has a focal length that varies in response to an electric field applied across the positive and negative terminals 122, 124 and is arranged to focus incoming electromagnetic radiation, typically visible or infra-red radiation, onto the sensor 108. The sensor 108 outputs a signal corresponding to the scene focused by the liquid lens to image processing circuitry (not shown).

With particular reference to FIG. 3, it will be appreciated that, in the present embodiment, the positive terminal 122 may be located at any point about the circumference of the outer surface 126, and the negative terminal 124 may be located at any point about the circumference of the side surface 128.

Figure 4:
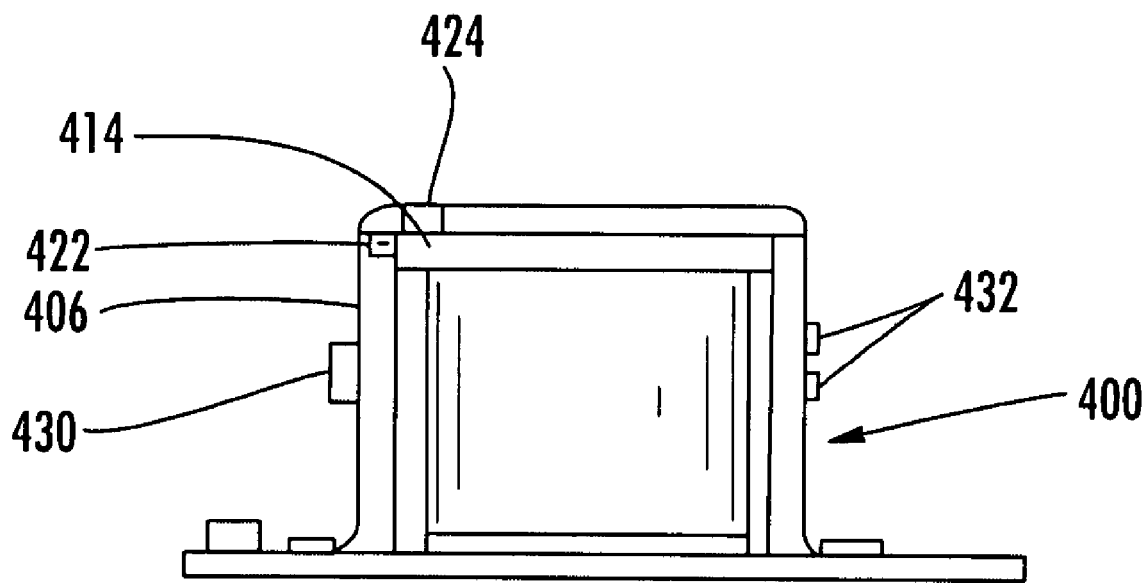
FIG. 4 is a side view of a sensor unit comprising a lens unit according to another aspect of the present invention.

Referring now to FIG. 4, the embodiment is substantially the same as that described in relation to FIGS. 1 to 3. Accordingly, similar parts will be accorded the same reference numerals. The flexible circuit 406 comprises electrical components 430, 432. Typically, the electrical components 430, 432 will comprise passive circuit elements as will be known to those skilled in the art. Alternatively or additionally, the electrical components 430, 432 may comprise drive circuitry for driving the liquid lens 414.

It will be appreciated that in the present embodiment the voltage and currents supplied to the flexible circuit 406 will have to be adjusted to allow for power dissipation by the electrical components 430, 432 in order that the correct voltage is supplied to the positive and negative terminals 422, 424 to ensure that the desired focusing properties are achieved.

It will be further appreciated that although described in relation to a liquid lens the present invention is suitable for use with any lens arrangement in which the focal characteristics of the lens vary with an applied electric field.

While various embodiments of the invention have been described, it will be apparent to those skilled in the art, once given this disclosure, that various modifications, changes, improvements and variations may be made without departing from the scope of the invention.

That which is claimed:

1. A lens unit comprising:
    a liquid lens having a variable focal length that is responsive to an applied electrical field; and
    an electrical connector comprising a flexible circuit for coupling said liquid lens to an electrical power supply.

2. A lens unit according to claim 1 wherein said liquid lens comprises first and second terminals.

3. A lens unit according to claim 2 wherein said electrical connector is for coupling at least one of the first and second terminals of said liquid lens to the electrical power supply.

4. A lens unit according to claim 2 further comprising an electrically conducting adhesive for coupling said electrical connector to at least one of the first and second terminals.

5. A lens unit according to claim 1 further comprising an electrically conducting adhesive for coupling said electrical connector to the electrical power supply.

6. A lens unit according to claim 1 further comprising at least one electrical component on said flexible circuit.

7. A lens unit according to claim 6 wherein said at least one electrical component comprises a passive electrical component.

8. A lens unit according to claim 1 further comprising at least one circuit on said flexible circuit.

9. A lens unit according to claim 8 wherein said at least one circuit comprises a drive circuit for driving said liquid lens.

10. An electronic device comprising:
    an electrical power supply;
    a liquid lens having a variable focal length that is responsive to an applied electrical field; and
    an electrical connector comprising a flexible circuit for coupling said liquid lens to said electrical power supply.

11. An electronic device according to claim 10 wherein said liquid lens comprises first and second terminals; and wherein said electrical connector is coupled to at least one of the first and second terminals of said liquid lens and to said electrical power supply.

12. An electronic device according to claim 10 further comprising at least one electrical component on said flexible circuit.

13. An electronic device according to claim 12 wherein said at least one electrical component comprises a passive electrical component.

14. An electronic device according to claim 10 further comprising at least one circuit on said flexible circuit.

15. An electronic device according to claim 14 wherein said at least one circuit comprises a drive circuit for driving said liquid lens.

16. An electronic device according to claim 10 wherein said electrical power supply and said liquid lens are configured so that the electronic device is at least one of a digital still camera, a digital video camera, a mobile telephone, a webcam, and an endoscope.

17. A digital camera comprising:
    a liquid lens having a variable focal length that is responsive to an applied electrical field, said liquid lens comprising first and second terminals;
    an image sensor adjacent said liquid lens;
    an electrical connector comprising a flexible circuit coupled to the first and second terminals of said liquid lens; and
    at least one drive circuit on said flexible circuit for driving said liquid lens.

18. A digital camera according to claim 17 further comprising an electrically conducting adhesive for coupling said electrical connector to the first and second terminals.

19. A digital camera according to claim 17 wherein said electrical connector is to be coupled to an electrical power supply.

20. A digital camera according to claim 17 further comprising at least one electrical component on said flexible circuit.

21. A digital camera according to claim 20 wherein said at least one electrical component comprises a passive electrical component.

22. A method for making a lens unit comprising:
    providing a liquid lens having a variable focal length that is responsive to an applied electrical field; and
    coupling the liquid lens to an electrical power supply using an electrical connector comprising a flexible circuit.

23. A method according to claim 22 wherein the liquid lens comprises first and second terminals.

24. A method according to claim 23 further comprising coupling the electrical connector to at least one of the first and second terminals of the liquid lens.

25. A method according to claim 24 further comprising using an electrically conducting adhesive for coupling the electrical connector to at least one of the first and second terminals.

26. A method according to claim 22 further comprising using an electrically conducting adhesive for coupling the electrical connector to the electrical power supply.

27. A method according to claim 22 wherein the lens unit further comprises at least one electrical component on the flexible circuit, the at least one electrical component comprising a passive electrical component.

28. A method according to claim 22 wherein the lens unit further comprises at least one circuit on the flexible circuit, the at least one circuit comprising a drive circuit for driving the liquid lens.

* * * * *